US008216882B2

(12) United States Patent
Lin et al.

(10) Patent No.: US 8,216,882 B2
(45) Date of Patent: Jul. 10, 2012

(54) METHOD OF PRODUCING A MICROELECTROMECHANICAL (MEMS) SENSOR DEVICE

(75) Inventors: Yizhen Lin, Gilbert, AZ (US); Woo Tae Park, Singapore (SG); Mark E. Schlarmann, Chandler, AZ (US); Hemant D. Desai, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 24 days.

(21) Appl. No.: 12/861,509

(22) Filed: Aug. 23, 2010

(65) Prior Publication Data

US 2012/0043627 A1 Feb. 23, 2012

(51) Int. Cl.
*H01L 21/44* (2006.01)
*H01L 21/48* (2006.01)
*H01L 21/50* (2006.01)

(52) U.S. Cl. ............. 438/113; 438/114; 257/E29.001

(58) Field of Classification Search ............... 438/113, 438/114; 257/415, 416, 417, E29.001
See application file for complete search history.

(56) References Cited

U.S. PATENT DOCUMENTS

| 5,804,086 | A | 9/1998 | Bruel |
| 6,939,473 | B2 | 9/2005 | Nasiri et al. |
| 2007/0295456 | A1 * | 12/2007 | Gudeman et al. ......... 156/379.7 |
| 2008/0022777 | A1 | 1/2008 | Tan et al. |
| 2010/0052082 | A1 * | 3/2010 | Lee et al. .................... 257/416 |
| 2010/0242603 | A1 * | 9/2010 | Miller et al. ............... 73/514.32 |
| 2011/0126632 | A1 * | 6/2011 | McNeil et al. .................. 73/718 |

OTHER PUBLICATIONS

Knese et al., Novel Technology for Capacitive Pressure Sensors with Monocrystalline Silicon Membranes, IEEE, 2009, pp. 697-700.

* cited by examiner

*Primary Examiner* — Phuc Dang
(74) *Attorney, Agent, or Firm* — Meschkow & Gresham, P.L.C.

(57) ABSTRACT

A device (20, 90) includes sensors (28, 30) that sense different physical stimuli. A pressure sensor (28) includes a reference element (44) and a sense element (52), and an inertial sensor (30) includes a movable element (54). Fabrication (110) entails forming (112) a first substrate structure (22, 92) having a cavity (36, 100), forming a second substrate structure (24) to include the sensors (28, 30), and coupling (128) the substrate structures so that the first sensor (28) is aligned with the cavity (36, 100) and the second sensor (30) is laterally spaced apart from the first sensor (28). Forming the second structure (24) includes forming (118) the sense element (52) from a material layer (124) of the second structure (24) and following coupling (128) of the substrate structures, concurrently forming (132) the reference element (44) and the movable element (54) in a wafer substrate (122) of the second structure (24).

20 Claims, 5 Drawing Sheets

METHOD OF PRODUCING A MICROELECTROMECHANICAL (MEMS) SENSOR DEVICE

RELATED INVENTION

The present invention is related to "MEMS Pressure Sensor Device and Method of Fabricating Same," by Yizhen Lin, Woo Tae Park, Mark E. Schlarmann, and Hemant D. Desai filed on the same date as the present application, which is incorporated by reference herein.

1. Technical Field of the Invention

The present invention relates generally to microelectromechanical (MEMS) sensor devices. More specifically, the present invention relates to a MEMS sensor device with multiple stimulus sensing capability and a method of fabricating the MEMS sensor device.

2. Background of the Invention

Microelectromechanical systems (MEMS) devices are semiconductor devices with embedded mechanical components. MEMS devices include, for example, pressure sensors, accelerometers, gyroscopes, microphones, digital mirror displays, micro fluidic devices, and so forth. MEMS devices are used in a variety of products such as automobile airbag systems, control applications in automobiles, navigation, display systems, inkjet cartridges, and so forth. Capacitive-sensing MEMS device designs are highly desirable for operation in miniaturized devices due to their low temperature sensitivity, small size, and suitability for low cost mass production.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

As the uses for MEMS sensor devices continue to grow and diversify, increasing emphasis is being placed on the development of advanced silicon MEMS sensor devices capable of sensing different physical stimuli at enhanced sensitivities and for integrating these sensors into the same package. In addition, increasing emphasis is being placed on fabrication methodology for MEMS sensor devices that achieves multiple stimulus sensing capability and enhanced sensitivity without increasing manufacturing cost and complexity and without sacrificing part performance. These efforts are primarily driven by existing and potential high-volume applications in automotive, medical, commercial, and consumer products.

An embodiment of the invention entails a microelectromechanical systems (MEMS) sensor device capable of sensing different physical stimuli. In particular, the MEMS sensor device includes laterally spaced integrated sensors, each of which may sense a different physical stimulus. In an embodiment, one sensor of the MEMS sensor device is a pressure sensor that uses a diaphragm and a pressure cavity to create a variable capacitor to detect strain (or deflection) due to applied pressure over an area and another sensor may be an inertial sensor, such as an accelerometer, gyrometer, and so forth capable of creating a variable capacitance in response to a sensed motion stimulus.

Fabrication methodology for the MEMS sensor device entails a stacked configuration of two substrate structures with laterally spaced sensors interposed between one of the substrate structures and a cap wafer. In an embodiment, the pressure sensor of the MEMS sensor device includes a buried reference cavity fabricated into one of the substrate structures. In another embodiment, a sealed cavity is formed by coupling the cap wafer to one of the substrate structures to form the reference cavity. Forming a sensor having multiple stimulus sensing capability in a miniaturized package has been sought for use in a number of applications. Thus far, however, such a MEMS sensor device has not been realistically achievable in part due to the effects of material layer thickness of the various movable elements on sensor functionality and sensitivity. That is, some prior art fabrication techniques yield structures that are undesirably thick and may therefore not function adequately as a movable diaphragm capable of detecting strain due to applied pressure. As such, these structures may have undesirably low sensitivity. Fabrication methodology described herein yields a MEMS multiple stimulus sensor device with enhanced sensitivity, that is durable, and that can be cost effectively fabricated utilizing existing manufacturing techniques.

Figure 1:
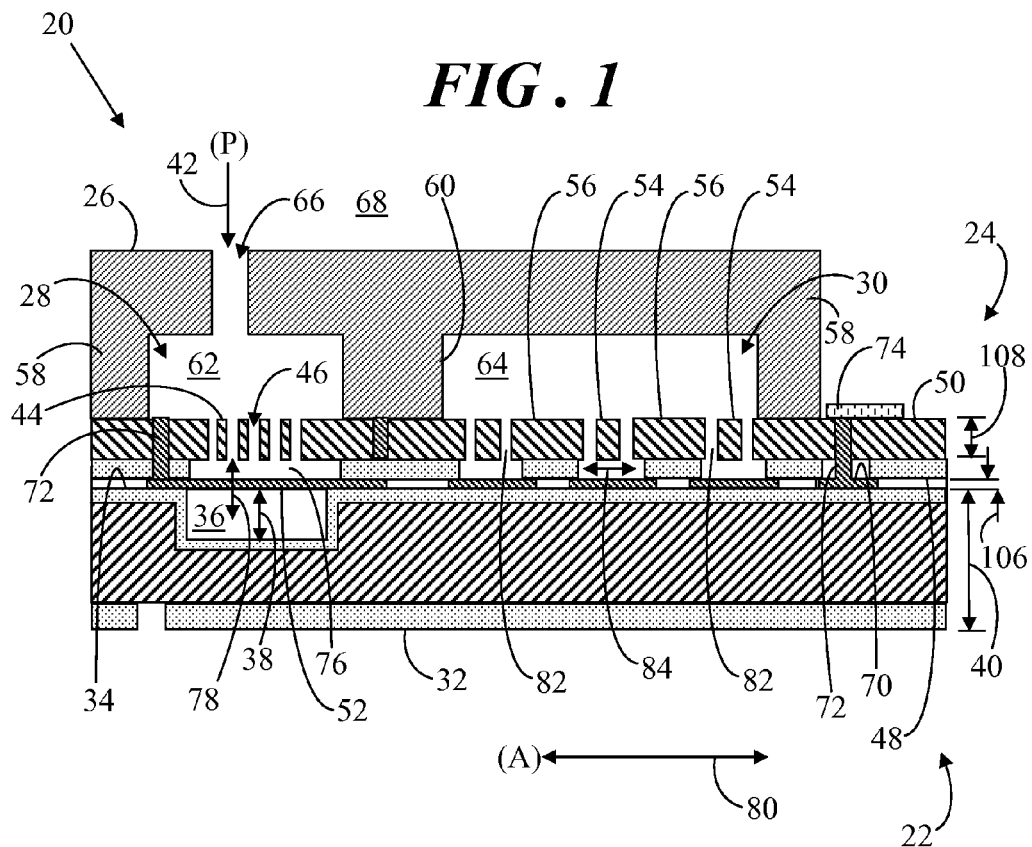
FIG. 1 shows a sectional side view of a microelectromechanical systems (MEMS) sensor device having multiple stimulus sensing capability in accordance with an embodiment.

FIG. 1 shows a sectional side view of a microelectromechanical systems (MEMS) sensor device 20 having multiple stimulus sensing capability in accordance with an embodiment. FIG. 1 and subsequent FIGS. 2 and 4-10 are illustrated using various shading and/or hatching to distinguish the different elements of MEMS sensor device 20, as will be discussed below. These different elements within the structural layers may be produced utilizing current and upcoming micromachining techniques of depositing, patterning, etching, and so forth.

MEMS sensor device 20 includes a first substrate structure 22, a second substrate structure 24 coupled to first substrate structure 22, and a cap 26 attached to second substrate structure 24. A first sensor 28 and a second sensor 30 are formed in second substrate structure 24. Second sensor 30 is laterally spaced apart from first sensor 28 and both sensors 28 and 30 are interposed between first substrate structure 22 and cap 26. The terms "first" and "second" used herein do not refer to an ordering or prioritization of elements within a countable series of elements. Rather, the terms "first" and "second" are used to distinguish the particular elements for clarity of discussion.

First substrate structure 22 includes a first side 32 and a second side 34. A cavity 36 extends inwardly from second side 34 of first substrate structure 22. In the illustrated embodiment, cavity 36 has a depth 38 that is less than a thickness 40 of first substrate structure 22. Accordingly, cavity 36 does not extend completely through first substrate structure 22.

In an embodiment, first sensor 28 is a pressure sensor configured to sense a pressure stimulus (P), represented by an arrow 42. As such, first sensor 28 is referred to hereinafter as pressure sensor 28. Pressure sensor 28 includes a reference element 44 formed in second substrate structure 24 and aligned with cavity 36. Reference element 44 includes a plurality of openings 46 extending through second substrate structure 24. Second substrate structure 24 further includes a first side 48 and a second side 50. A sense element 52 is disposed on first side 48 of second substrate structure 24, and is aligned with reference element 44. Thus, when first and second substrate structures 22 and 24, respectively, are coupled in a vertically stacked arrangement, sense element 52 is interposed between cavity 36 of first substrate structure 22 and reference element 44 of second substrate structure 24. In particular, sense element 52 spans cavity 36.

In an embodiment, second sensor 30 is an inertial sensor configured to sense motion. As such, second sensor 30 is referred to hereinafter as inertial sensor 30. Inertial sensor 30 includes a movable element, referred to herein as a proof mass 54, interposed between fixed elements 56 all of which are formed in second substrate structure 24. In an embodiment, proof mass 54 may be a frame-like structure anchored to fixed elements 56 via one or more spring members (not shown) that enable movement of proof mass 54 relative to fixed elements 56. Various alternative anchoring schemes may be implemented to enable movement of proof mass 54 relative to fixed elements 56.

Cap 26 is attached to second side 50 of second substrate structure 24, and includes outer perimeter walls 58 and a section wall 60 internal to cap 26. Section wall 60 defines a boundary between a first chamber 62 and a second chamber 64 of cap 26. Thus, second chamber 64 is physically isolated from first chamber 62. First sensor 28 resides in first chamber 62 and second sensor 30 resides in second chamber 64. In an embodiment, second chamber 64 is a hermetically sealed chamber in which second sensor 30 is located. However, cap 26 includes a port 66 extending through cap 26 into first chamber 62 so that sense element 52 is exposed to an environment 68 external to MEMS sensor device 20. MEMS sensor device 20 may additionally include one or more internal connection sites (not shown), conductive traces 70, conductive vias 72, and/or one or more external connection sites 74 (of which one is shown) that may be formed concurrently with other components of MEMS sensor device 20 in accordance with design requirements for device 20.

As mentioned above, pressure sensor 28 of MEMS sensor device 20 is configured to sense pressure stimulus (P) 42 from environment 68 external to MEMS sensor device 20. Sense element 52, referred to hereinafter as a diaphragm 52, is exposed to external environment 68 via port 66 extending through cap 26 and subsequently via openings 46 in reference element 44. Diaphragm 52 is spaced apart from reference element 44 to form a gap 76 between sense element 52 and reference element 44. Diaphragm 52 is capable of movement in a direction 78 that is generally perpendicular to a plane of second substrate structure 24, e.g., first side 48 of second substrate structure 24, in response to pressure stimulus 42.

Pressure sensor 28 uses diaphragm 52 and the pressure within cavity 36 (typically less than atmospheric pressure) to create a variable capacitor to detect strain due to applied pressure, i.e., pressure stimulus 42. As such, pressure sensor 28 senses pressure stimulus 42 from environment 68 as movement of diaphragm 52 relative to reference element 44. A change in capacitance between reference element 44 and diaphragm 52 as a function of pressure stimulus 42 can be registered by sense circuitry (not shown) and converted to an output signal representative of pressure stimulus 42.

In this exemplary embodiment, inertial sensor 30 of MEMS sensor device 20 is configured to sense linear acceleration (A), represented by a bi-directional arrow 80. Proof mass 54 is spaced apart from fixed elements 56 to form gaps 82 between adjacent portions of proof mass 54 and fixed elements 56. Proof mass 54 is capable of movement in a direction 84 that is generally parallel to a plane of second substrate structure 24, e.g., first side 48 of second substrate structure 24, in response to acceleration 80. Movement of proof mass 54 is sensed by fixed elements 56. A change in a capacitance between fixed elements 56 and proof mass 54 as a function of acceleration 80 can be registered by sense circuitry (not shown) and converted to an output signal representative of acceleration 80.

Although inertial sensor 30 is presented as a single axis linear accelerometer, it should be understood that in alternative embodiments, inertial sensor 30 may be configured to sense linear motion in more than one direction and/or may be configured to sense angular or rotational movement. In still other embodiments, second sensor 30 may be configured to detect other physical stimuli, such as a magnetic field sensing, optical sensing, electrochemical sensing, and so forth.

Figure 2:
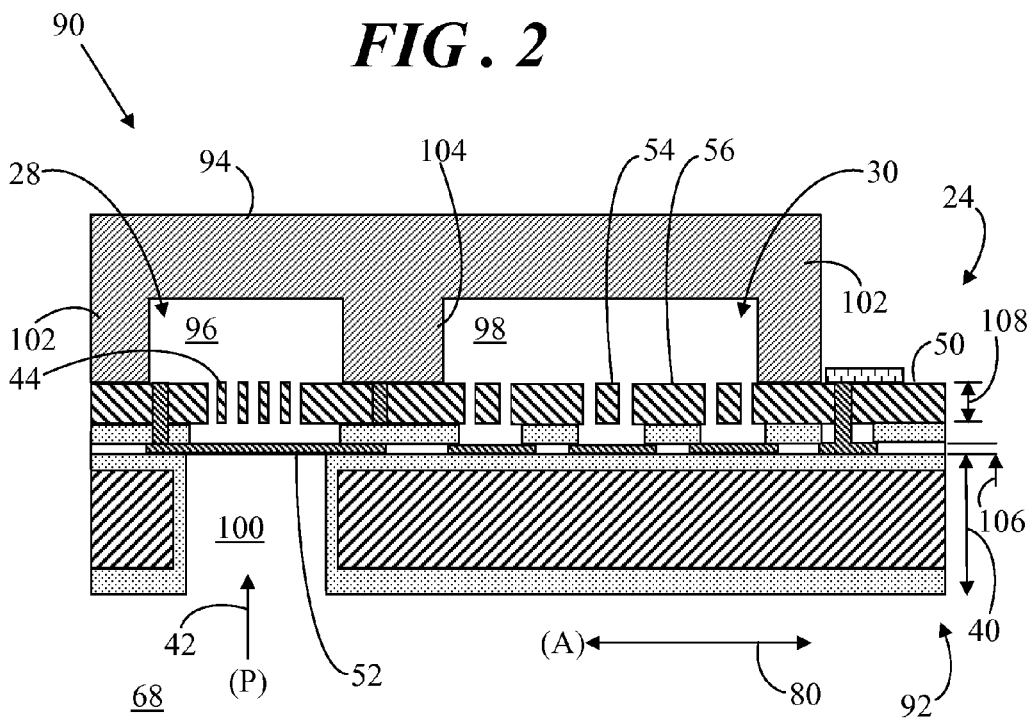
FIG. 2 shows a sectional side view of a MEMS sensor device having multiple stimulus sensing capability in accordance with another embodiment.

FIG. 2 shows a sectional side view of a MEMS sensor device 90 having multiple stimulus sensing capability in accordance with another embodiment. MEMS sensor device 90 includes a first substrate structure 92, a second substrate structure (i.e., second substrate structure 24) coupled to first substrate structure 92, and a cap 94 coupled to second side 50 of second substrate structure 24. Pressure sensor 28 resides in a first chamber 96 of cap 94, and inertial sensor 30 resides in a second chamber 98 of cap 94 that is physically isolated from first chamber 96. First substrate structure 92 of device 90 differs from first substrate structure 22 of device 20 in that first substrate structure 92 has a cavity 100 that extends completely through thickness 40 of first substrate structure 92. However, the same second substrate structure 24 is implemented in each of MEMS sensor devices 20 and 90. Accordingly, a thorough description of second substrate structure 24 need not be repeated in connection with the description of MEMS sensor device 90.

Like MEMS sensor device 20 (FIG. 1), reference element 44 of pressure sensor 28 is aligned with cavity 100 of first substrate structure 92, and diaphragm 52 is aligned with reference element 44. In the illustrated embodiment, cap 94 does not include a port. Rather, diaphragm 52 is exposed to external environment 68 via cavity 100, and first chamber 96 serves as the reference pressure cavity at or near vacuum. Thus, diaphragm 52 and first chamber 96 function cooperatively to create the variable capacitor for detecting strain due to applied pressure, i.e., pressure stimulus 42.

In an embodiment, cap 94 is shown with outer perimeter walls 102 and a section wall 104 internal to cap 94 that define a boundary between first and second chambers 96 and 98, respectively. Thus, second chamber 98 is physically isolated from first chamber 96. First chamber 96 is a hermetically sealed first chamber so as to appropriately function as a reference pressure cavity, and it may be desirable to hermetically seal second chamber 98 in order to protect the components of inertial sensor 30. Accordingly, in some embodiments, a cap may not have separately defined chambers, but may instead have a single hermetically sealed chamber in which both pressure sensor 28 and inertial sensor 30 reside.

In the embodiment of FIG. 2, sensor 28 is described as being a pressure sensor. However, in an alternative embodiment, sensor 28 may be a condenser (capacitive) microphone for sensing sound and converting it into an electrical signal. A condenser microphone operates similarly to a capacitive pressure sensor, except that the microphone typically has a perforated stationary plate to reduce acoustic resistance so that the air can escape into a larger chamber. As shown in FIG. 2, the perforated reference element 44 and first chamber 96 can be embodied as a portion of a condenser microphone. Therefore, MEMS sensor device 90 may be any combination of two or more of a pressure sensor, inertial sensor, and microphone.

Referring to FIGS. 1 and 2, fabrication methodology (discussed below) for MEMS sensor devices 20 and 90, yields diaphragm 52 having a thickness 106 that is significantly less than a thickness 108 of reference element 44. In some embodiments, thickness 106 of diaphragm 52 may be less than fifteen percent of thickness 108 of reference element 44. In a more particular embodiment, thickness 106 of diaphragm 52 may be approximately two microns and thickness 108 of reference element 44 may be approximately twenty-five microns. This configuration enables the deflection of diaphragm 52 in response to pressure stimulus 42 relative to reference element 44.

Figure 3:
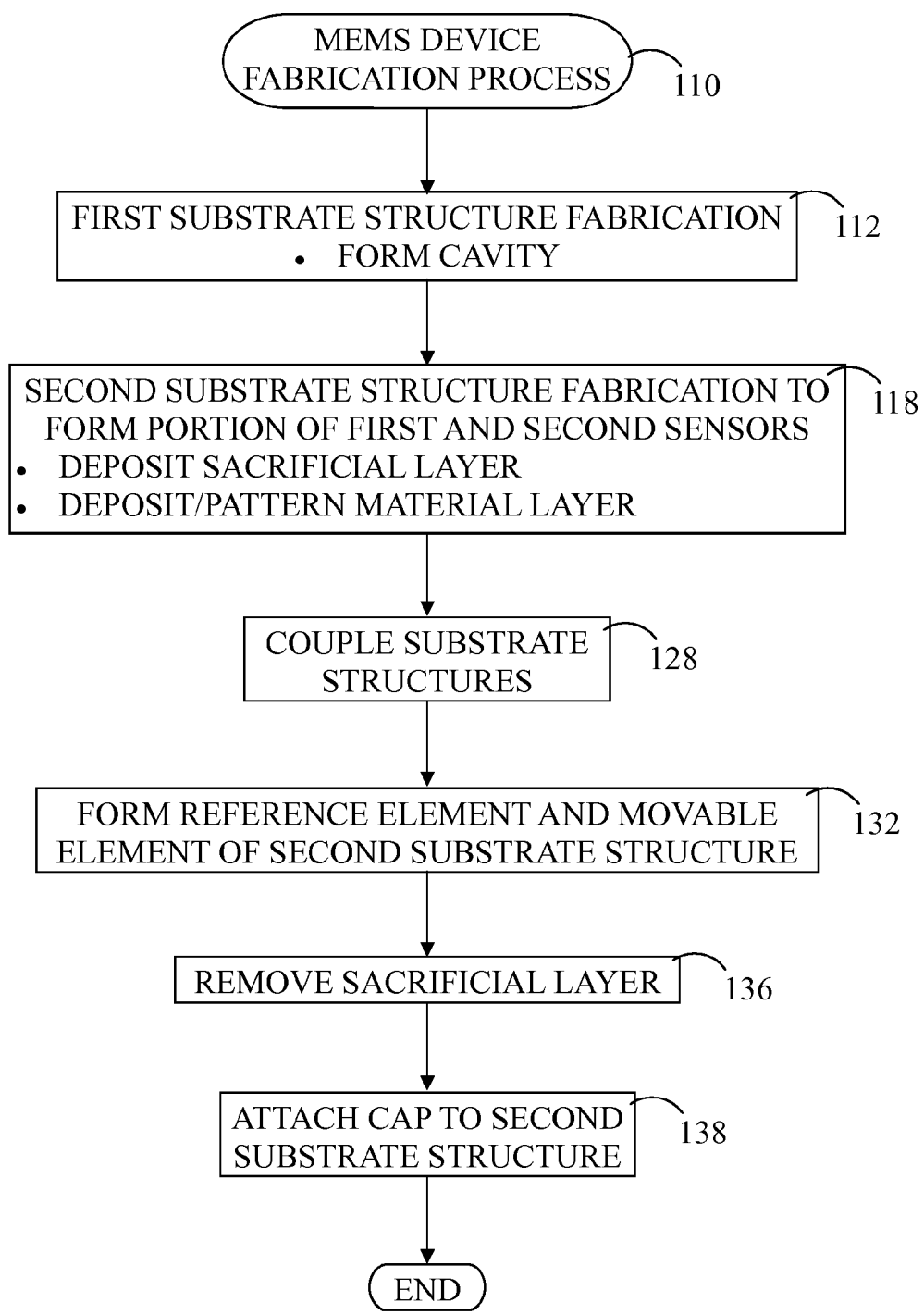
FIG. 3 shows a flowchart of a fabrication process for producing either of the MEMS sensor devices of FIGS. 1 and 2 in accordance with another embodiment.

FIG. 3 shows a flowchart of a fabrication process 110 for producing either of the MEMS sensor devices 20 and 90 (FIGS. 1 and 2) in accordance with another embodiment. Process 110 generally describes methodology for concurrently forming the elements of the laterally spaced sensors 28 and 30. Fabrication process 110 implements known and developing MEMS micromachining technologies to cost effectively yield MEMS sensor device 20 or 90 having multiple stimulus sensing capability. Fabrication process 110 is described below in connection with the fabrication of a single MEMS sensor device 20. However, it should be understood by those skilled in the art that the following process allows for concurrent wafer-level manufacturing of a plurality of MEMS sensor devices 20, or alternatively, MEMS sensor devices 90. The individual devices 20 can then be separated, cut, or diced in a conventional manner to provide individual MEMS sensor devices 20 that can be packaged and integrated into an end application.

MEMS sensor device fabrication process 110 begins with an activity 112. At activity 112, fabrication processes related to the formation of first substrate structure 22 are performed.

Figure 4:
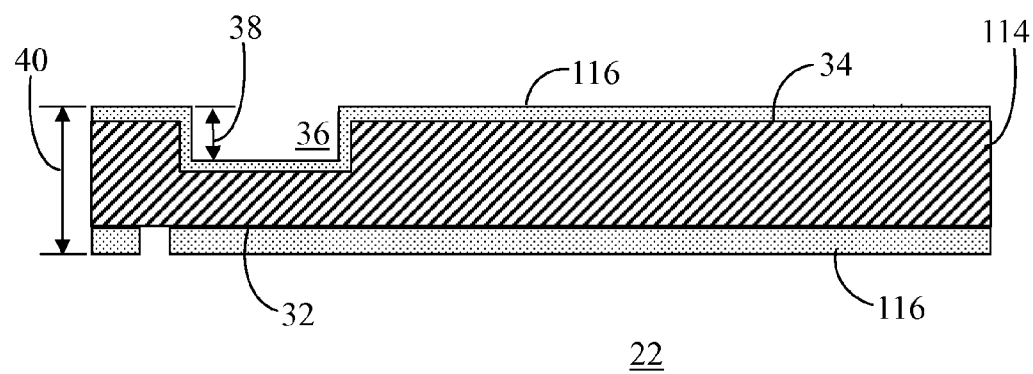
FIG. 4 shows a side sectional view of a substrate structure fabricated in accordance with the process of FIG. 3 for incorporation in the MEMS sensor device of FIG. 1.

Referring to FIG. 4 in connection with activity 112, FIG. 4 shows a side sectional view of first substrate structure 22 fabricated in accordance with process 110 for incorporation in MEMS sensor device 20 (FIG. 1). In an embodiment, cavity 36 is formed in a silicon wafer 114, using for example a Deep Reactive Ion Etch (DRIE) technique, a Potassium Hydroxide (KOH) etch technique, or any suitable process, so that the depth of cavity 36 formed in wafer 114 is less than the thickness of wafer 114. A rightwardly and upwardly directed wide hatch pattern is utilized to represent wafer 114 in the various figures.

Wafer 114 may subsequently be provided with one or more insulating or conductive layers. This layering is exemplified in FIG. 4 by the provision of a blanket insulating layer 116 of, for example, silicon oxide. Insulating layer 116 may be formed on each of first and second sides 32 and 34 and in cavity 36 by performing a local oxidation of silicon (LOCOS) microfabrication process or any other suitable process. A small stipple pattern is utilized to represent insulating layer 116 in the various figures. Other fabrication activities may be performed per convention that are not discussed or illustrated herein for clarity of description. Accordingly, at activity 112, first substrate structure 22 is produced with cavity 36 having depth 38 that is less than the final thickness 40 of first substrate structure 22.

With reference back to FIG. 3, fabrication process 110 continues with an activity 118. At activity 118, fabrication processes related to the formation of at least a portion of pressure sensor 28 (FIG. 1) and inertial sensor 30 (FIG. 1) of second substrate structure 24 are performed.

Figure 5:
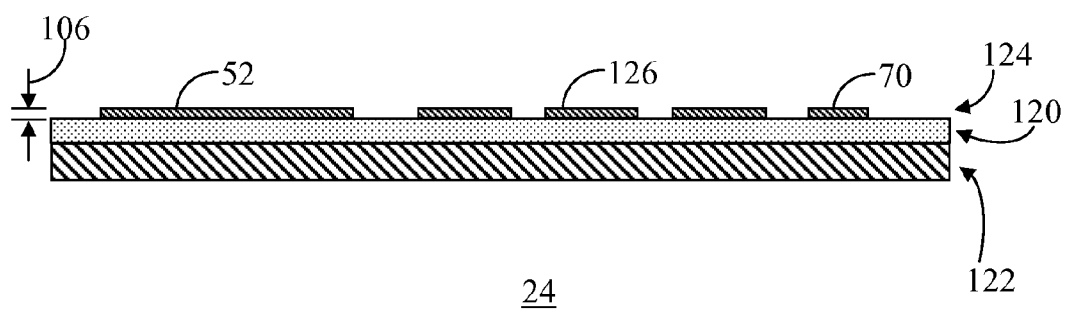
FIG. 5 shows a side sectional view of another substrate structure fabricated in accordance with the process of FIG. 3 for incorporation in the MEMS sensor device of FIG. 1.

Referring now to FIG. 5 in connection with activity 118, FIG. 5 shows a side sectional view of second substrate structure 24 fabricated in accordance with activity 118 of process 110 for incorporation in MEMS sensor device 20 (FIG. 1). Of course, MEMS sensor device 90 (FIG. 2) utilizes the same structure of second substrate structure 24. Thus, second substrate structure 24 fabricated in accordance with activity 118 of process 110 may alternatively be incorporated in MEMS sensor device 90 (FIG. 2).

In accordance with activity 118, fabrication of second substrate structure 24 entails the deposition of an insulating layer, referred to herein as a sacrificial layer 120, for example, silicon oxide, phosphosilicate glass (PSG), and the like on a wafer 122. A rightwardly and downwardly directed wide hatch pattern is utilized to represent wafer 122 in the various figures, and a small stipple pattern is utilized to represent sacrificial layer 120 in the various figures.

Next, a material layer 124 is formed over sacrificial layer 120 by, for example, chemical vapor deposition, physical vapor deposition, or any other suitable process. Material layer 124 may then be selectively patterned and etched to form at least diaphragm 52 of MEMS sensor device 20 (FIG. 1). In addition, material layer 124 may be selectively patterned and etched to form one or more components of inertial sensor 30 (FIG. 1), such as, for example, an electrode element 126, conductive traces 70, and so forth, in accordance with predetermined design requirements. Material layer 124 may be, for example, polycrystalline silicon also referred to as polysilicon or simply poly, although other suitable materials may alternatively be utilized to form material layer 124. Material layer 124 may additionally be thinned and polished by performing, for example, Chemical-Mechanical Planarization (CMP) or another suitable process to yield diaphragm 52 and one or more electrode elements 120 and conductive traces 70, each having thickness 106 of, for example, two microns. A rightwardly and downwardly directed narrow hatch pattern is utilized to represent material layer 124 in the various figures.

With reference back to FIG. 3, following fabrication activities 112 and 118, MEMS device fabrication process 110 continues with an activity 128. At activity 128, second substrate structure 24 (FIG. 5) is coupled with first substrate structure 22 (FIG. 4).

Figure 6:
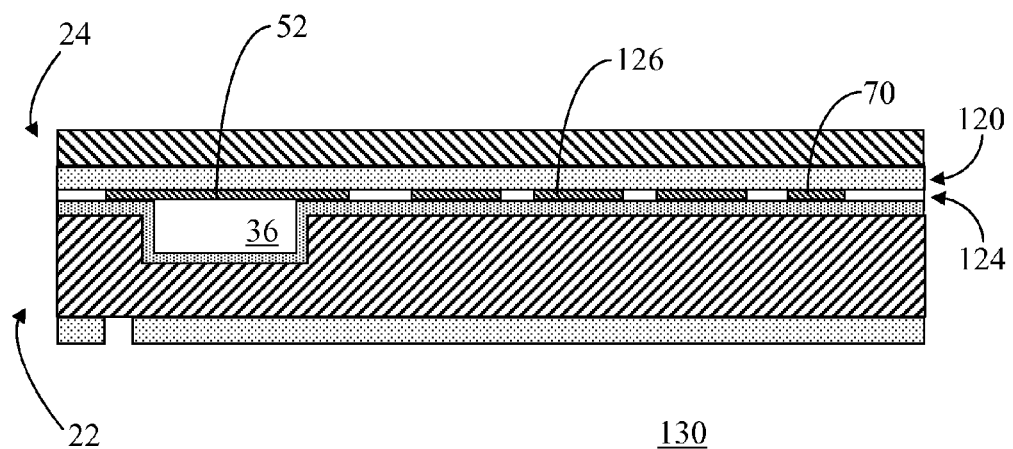
FIG. 6 shows a side sectional view of the substrate structures of FIGS. 4 and 5 coupled together in a subsequent stage of processing.

Referring now to FIG. 6 in connection with activity 128, FIG. 6 shows a side sectional view of first and second substrate structures 22 and 24 coupled in a subsequent stage 130 of processing. In an embodiment, first and second substrate structures 22 and 24 are bonded together using, for example, a silicon direct bonding technique under vacuum. Thus, once bonded, sense element 52 is interposed between first and second substrate structures 22 and 24, respectively, and cavity 36 is formed as a buried cavity with evacuated pressure. That is, a pressure within cavity 36 is significantly less than ambient or atmospheric pressure.

With reference back to FIG. 3, following coupling activity 128, MEMS device fabrication process 110 continues with an activity 132. At activity 132, reference element 44 (FIG. 1), the movable element, i.e., proof mass 54, and fixed elements 56 are formed in second substrate structure 24.

Figure 7:
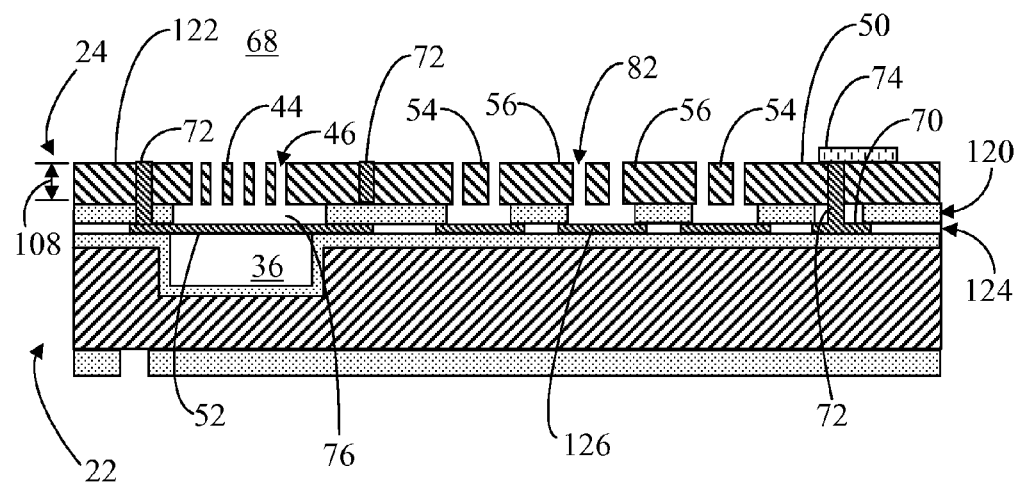
FIG. 7 shows a side sectional view of the structure of FIG. 6 in a subsequent stage of processing.

Referring to FIG. 7 in connection with activity 132, FIG. 7 shows a side sectional view of the device of FIG. 6 in a subsequent stage 134 of processing. In an embodiment, activity 132 entails polishing or otherwise planarizing second side 50 of second substrate structure 24 to a final thickness 108 of, for example, approximately twenty-five microns. Wafer 122 of second substrate structure 24 is patterned by, for example, DRIE or KOH etching, so that openings 46 are created in reference element 44 overlying diaphragm 52 and cavity 36. Concurrently, wafer 122 of second substrate structure 24 is patterned so that proof mass 54 and fixed elements 56 are formed in wafer 122, and so that gaps 82 are formed between proof mass 54 and fixed elements 56.

In the illustrated embodiment, openings 46 in reference element 44 serve as pressure vent holes so that diaphragm 52 is exposed to environment 68, with or without cap 26 (FIG. 1), for detection of pressure stimulus 42 (FIG. 1). Other processes that may be associated with activity 132 can include patterning, etching, and deposition of the appropriate materials to form conductive vias 72, external connection sites 74, and so forth in accordance with design requirements for device 20.

With reference back to FIG. 3, following activity 132, MEMS sensor device fabrication process 110 continues with an activity 136. At activity 136, sacrificial layer 120 underlying reference element 44 is removed to enable movement of diaphragm 52. In addition, sacrificial layer 120 underlying proof mass 54 is removed to enable movement of proof mass 54.

Again referring to FIG. 7, at stage 134 of processing, sacrificial layer 120 has been removed between reference element 44 and diaphragm 52 so that gap 76 is formed between reference element 44 and diaphragm 52. Openings 46 in reference element 44 and gaps 82 between proof mass 54 and fixed elements 56 enable passage of an etch material, or etchant, in order to remove the underlying sacrificial layer 120 at activity 136. In an embodiment, the etching of sacrificial layer 120 at activity 136 removes substantially an entirety of sacrificial layer 120 between reference element 44 and diaphragm 52 so that reference element 44 and diaphragm 52 are spaced apart from one another by gap 76. Likewise, substantially an entirety of sacrificial layer 120 underlying proof mass 54 is removed. With the appropriate removal of sacrificial layer 120 at activity 136, diaphragm 52 is free to move in direction 78 (FIG. 1) in response to external pressure stimulus 42 (FIG. 1) and proof mass 54 is free to move relative to fixed elements 56 in direction 84 in response to linear acceleration 80 (FIG. 1).

With reference back to FIG. 3, following activity 136, MEMS device fabrication process 110 continues with an activity 138. At activity 138, cap 26 (FIG. 1) having port 66 (FIG. 1) may be coupled to second side 50 of second substrate structure 24. Attachment of cap 26 to second substrate structure 24 may be accomplished using, for example, glass frit bonding, metal eutectic bonding, and the like.

Process 110 may continue with other conventional fabrication activities (not shown). These additional fabrication activities may include packaging, forming electrical interconnects, testing, separation, and so forth. Following fabrication of MEMS sensor device 20 (FIG. 1), fabrication process 110 ends with a buried cavity 36 and a thin, highly sensitive diaphragm 52 of a pressure sensor 28 having been formed concurrently with an inertial sensor 30 using existing, cost effective, MEMS fabrication operations and using a wafer bonding technique.

Figure 8:
FIG. 8 shows a side sectional view of a substrate structure fabricated in accordance with the process of FIG. 3 for incorporation in the MEMS sensor device of FIG. 2.
Figure 9:
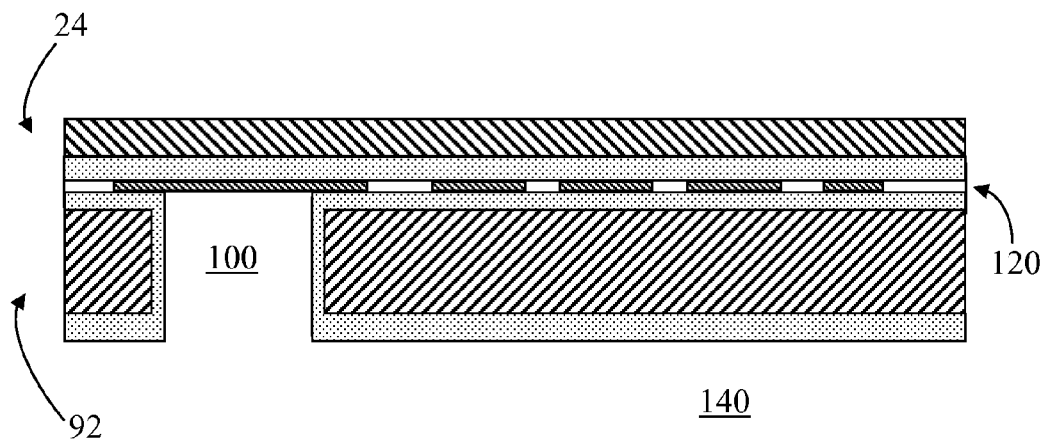
FIG. 9 shows a side sectional view of the substrate structures of FIGS. 5 and 8 coupled together in a subsequent stage of processing.
Figure 10:
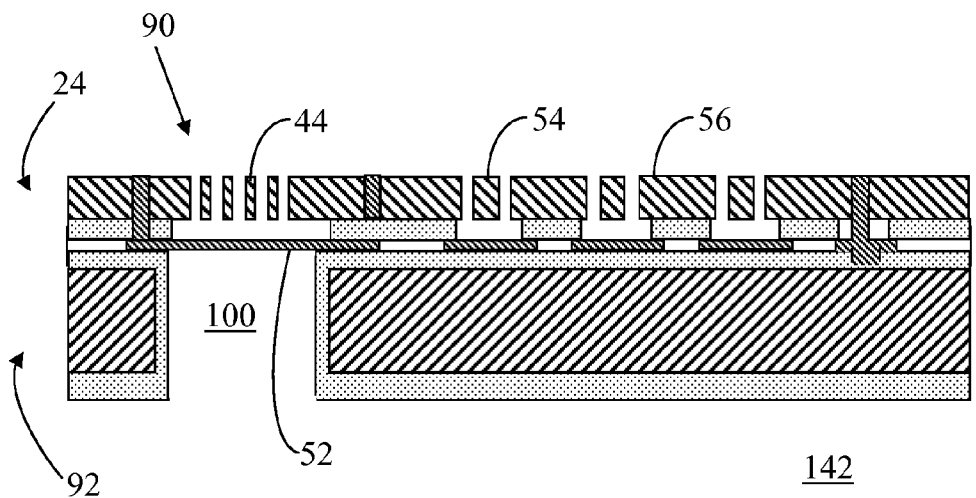
FIG. 10 shows a side sectional view of the structure of FIG. 9 in a subsequent stage of processing.

Referring to FIGS. 8-10, FIG. 8 shows a side sectional view of first substrate structure 92 fabricated in accordance with MEMS device fabrication process 110 (FIG. 3) for incorporation in MEMS sensor device 90 (FIG. 2). FIG. 9 shows a side sectional view of first substrate structure 92 and second substrate structure 24 coupled in a subsequent stage 140 of processing to form MEMS sensor device 90 (FIG. 2) having multiple stimulus sensing capability. FIG. 10 shows a side sectional view of the device of FIG. 9 in a subsequent stage 142 of processing.

FIGS. 8-10 are presented herein to demonstrate the implementation of MEMS device fabrication process 110 (FIG. 3) to fabricate MEMS sensor device 90. In particular, in this embodiment, cavity 100 is fabricated to extend through an entirety of first substrate structure 92. However, the remaining operations of fabricating second substrate structure 24 at activity 118 (FIG. 3), coupling first and second substrate structures 92 and 24 at activity 128 (FIG. 3), forming reference element 44, proof mass 54, and fixed elements 56 in second substrate structure 24 at activity 132 (FIG. 3), removing sacrificial layer 120 at activity 136 (FIG. 3), and attaching cap 94 (FIG. 2) to second substrate structure 24 remain largely unchanged.

Again, following fabrication of MEMS sensor device 90 (FIG. 2), fabrication process 110 ends having cost effectively produced device 90 that includes both pressure sensor 28 and inertial sensor 30, in which pressure sensor 28 is formed having a thin, highly sensitive diaphragm 52, cavity 100 functioning as a pressure port, and cap 94 being used to form a sealed reference chamber 96 (FIG. 2) of pressure sensor 28. Moreover, MEMS sensor device 90 has also been formed with multiple stimulus sensing capability using existing, cost effective MEMS fabrication operations and using a wafer bonding technique.

Embodiments described herein comprise compact MEMS sensor devices having multiple stimulus sensing capability. In particular, the MEMS sensor devices described herein include laterally spaced integrated sensors, each of which may sense a different physical stimulus. In an embodiment, one sensor of the MEMS sensor device is a pressure sensor that uses a diaphragm and a pressure cavity to create a variable capacitor to detect strain (or deflection) due to applied pressure over an area and another sensor may be an inertial sensor, such as an accelerometer, gyrometer, and so forth capable of creating a variable capacitance in response to a sensed motion stimulus.

Fabrication methodology for the MEMS sensor devices entails a stacked configuration of two substrate structures with laterally spaced sensors interposed between one of the substrate structures and a cap wafer. In an embodiment, the pressure sensor of a MEMS sensor device includes a buried reference cavity fabricated into one of the substrate structures. In another embodiment, a sealed cavity is formed by coupling the cap wafer to one of the substrate structures to form the reference cavity. The fabrication methodology results in a thin diaphragm for enhanced sensitivity to a pressure stimulus, the efficient production of a hermetically sealed reference pressure chamber, the effective integration of sensors capable of sensing different physical stimuli, and implementation of low cost existing MEMS batch processing techniques. The fabrication methodology yields a MEMS multiple stimulus sensor device with enhanced sensitivity, that is durable, that can be cost effectively fabricated utilizing existing manufacturing techniques, and that achieves the additional advantages of small size and low power consumption.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method of producing a microelectromechanical systems (MEMS) sensor device comprising:
    forming a first substrate structure having a cavity;
    forming at least a portion of a second substrate structure to include a first sensor and a second sensor laterally spaced apart from said first sensor;
    coupling said second substrate structure with said first substrate structure such that said first sensor is aligned with said cavity; and
    attaching a cap to said second substrate structure such that said first and second sensors are interposed between said cap and said first substrate structure, wherein said first sensor is exposed to an environment external to said MEMS sensor device via one of a group consisting of said cavity and said cap.

2. A method as claimed in claim 1 wherein said forming said second substrate structure comprises:
    forming a sense element of said first sensor from a material layer of said second substrate structure; and
    concurrently forming a reference element of said first sensor and a movable element of said second sensor in a wafer substrate of said second substrate structure following said coupling step.

3. A method as claimed in claim 2 wherein:
    said first sensor is a pressure sensor, and said sense element is a diaphragm interposed between said cavity and said reference element, said diaphragm being movable relative to said reference element in response to a pressure stimulus from said environment; and
    said second sensor is an inertial sensor adapted to sense a motion stimulus as movement of said movable element relative to a fixed element of said second sensor.

4. A method as claimed in claim 2 further comprising forming an electrode element of said second sensor from said material layer of said second substrate structure, said electrode element being formed concurrent with said sense element of said first sensor.

5. A method as claimed in claim 4 wherein said forming said sense element and said electrode element includes producing each of said sense and electrode elements having a first thickness that is less than a second thickness of said wafer substrate.

6. A method as claimed in claim 2 wherein:
    said forming said sense element comprises depositing a sacrificial layer on a surface of said wafer substrate, depositing said material layer on said sacrificial layer, and selectively removing a portion of said material layer to produce said sense element; and
    said method further comprises following said coupling operation, removing said sacrificial layer between said wafer substrate and said sense element to produce a gap between said reference element and said sense element and removing said sacrificial layer contacting said movable element to enable movement of said movable element.

7. A method as claimed in claim 1 wherein said cap includes a first chamber and a second chamber, said second chamber being physically isolated from said first chamber, and said attaching including arranging said cap on said second substrate structure such that said first sensor resides in said first chamber of said cap and said second sensor resides in said second chamber of said cap.

8. A method as claimed in claim 7 wherein said cap includes a port extending through said cap to expose said first chamber to said environment external to said MEMS sensor device, said forming said first substrate structure produces said cavity having a depth that is less than a thickness of said first substrate structure, and said first sensor is exposed to said environment via said port extending through said cap.

9. A method as claimed in claim 7 wherein said forming said first substrate structure produces said cavity extending through a thickness of said first substrate structure, said first chamber of said cap is a hermetically sealed chamber in which said first sensor resides, and said first sensor is exposed to said environment via said cavity.

10. A method as claimed in claim 7 wherein said second chamber of said cap is a hermetically sealed chamber in which said second sensor resides.

11. A method of producing a microelectromechanical systems (MEMS) sensor device comprising:
    forming a first substrate structure having a cavity;
    forming at least a portion of a second substrate structure to include a first sensor and a second sensor laterally spaced apart from said first sensor, said forming said at least a portion of said second substrate structure including forming a sense element of said first sensor from a material layer of said second substrate structure;
    coupling said second substrate structure with said first substrate structure such that said sense element is aligned with said cavity;
    following said coupling operation, concurrently forming a reference element of said first sensor and a movable element of said second sensor in a wafer substrate of said second substrate structure, said reference element being aligned with said sense element such that said sense element is interposed between said cavity and said reference element; and
    attaching a cap to said second substrate structure such that said first and second sensors are interposed between said cap and said first substrate structure, said cap having a first chamber and a second chamber, said second chamber being physically isolated from said first chamber, and said attaching including arranging said cap such that said first sensor resides in said first chamber and said second sensor resides in said second chamber, wherein said first sensor is exposed to an environment external to said MEMS sensor device via one of a group consisting of said cavity and said cap.

12. A method as claimed in claim 11 wherein:
    said first sensor is a pressure sensor, and said sense element is a diaphragm, said diaphragm being movable relative to said reference element in response to a pressure stimulus from said environment; and
    said second sensor is an inertial sensor adapted to sense a motion stimulus as movement of said movable element relative to a fixed element of said second sensor.

13. A method as claimed in claim 11 wherein said cap includes a port extending through said cap to expose said first chamber to said environment external to said MEMS sensor device, said forming said first substrate structure produces said cavity having a depth that is less than a thickness of said first substrate structure, and said first sensor is exposed to said environment via said port extending through said cap.

14. A method as claimed in claim 11 wherein said forming said first substrate structure produces said cavity extending through a thickness of said first substrate structure, said first chamber of said cap is a hermetically sealed chamber in which said first sensor resides, and said first sensor is exposed to said environment via said cavity.

15. A method of producing a microelectromechanical systems (MEMS) sensor device comprising:
 forming a first substrate structure having a cavity;
 forming at least a portion of a second substrate structure to include a first sensor and a second sensor laterally spaced apart from said first sensor, said forming said second substrate structure including:
  forming a sense element of said first sensor from a material layer of said second substrate structure;
  forming an electrode element of said second sensor from said material layer of said second substrate structure, said electrode element being formed concurrent with said sense element of said first sensor, wherein said forming said sense element and said electrode element includes depositing a sacrificial layer on a surface of said wafer substrate, depositing said material layer on said sacrificial layer, and selectively removing a portion of said material layer to produce said sense element and said electrode element; and
  concurrently forming a reference element of said first sensor and a movable element of said second sensor in a wafer substrate of said second substrate structure following said coupling step;
 coupling said second substrate structure with said first substrate structure such that said first sensor is aligned with said cavity;
 following said coupling operation, removing said sacrificial layer between said wafer substrate and said sense element to produce a gap between said reference element and said sense element and removing said sacrificial layer contacting said movable element to enable movement of said movable element; and
 attaching a cap to said second substrate structure such that said first and second sensors are interposed between said cap and said first substrate structure, wherein said first sensor is exposed to an environment external to said MEMS sensor device via one of a group consisting of said cavity and said cap.

16. A method as claimed in claim 15 wherein said forming said sense element and said electrode element includes producing each of said sense and electrode elements having a first thickness that is less than a second thickness of said wafer substrate.

17. A method as claimed in claim 15 wherein said cap includes a first chamber and a second chamber, said second chamber being physically isolated from said first chamber, and said attaching including arranging said cap on said second substrate structure such that said first sensor resides in said first chamber of said cap and said second sensor resides in said second chamber of said cap.

18. A method as claimed in claim 17 wherein:
 said cap includes a port extending through said cap to expose said first chamber to said environment external to said MEMS sensor device, said forming said first substrate structure produces said cavity having a depth that is less than a thickness of said first substrate structure, said first sensor being exposed to said environment via said port extending through said cap; and
 said second chamber of said cap is a hermetically sealed chamber in which said second sensor resides such that said second sensor is protected from said environment.

19. A method as claimed in claim 17 wherein:
 said forming said first substrate structure produces said cavity extending through a thickness of said first substrate structure, said first chamber of said cap is a hermetically sealed chamber in which said first sensor resides, said first sensor being exposed to said environment via said cavity; and
 said second chamber of said cap is a hermetically sealed chamber in which said second sensor resides such that said second sensor is protected from said environment.

20. A method as claimed in claim 15 wherein:
 said first sensor is a pressure sensor, and said sense element is a diaphragm interposed between said cavity and said reference element, said diaphragm being movable relative to said reference element in response to a pressure stimulus from said environment; and
 said second sensor is an inertial sensor adapted to sense a motion stimulus as movement of said movable element relative to a fixed element of said second sensor.

\* \* \* \* \*